(12) United States Patent
Li (10) Patent No.: US 9,559,337 B2
(45) Date of Patent: Jan. 31, 2017

(54) METHOD FOR MANUFACTURING FLEXIBLE DISPLAY DEVICE

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/761,307

(22) PCT Filed: May 21, 2015

(86) PCT No.: PCT/CN2015/079483
§ 371 (c)(1),
(2) Date: Jul. 16, 2015

(87) PCT Pub. No.: WO2016/173016
PCT Pub. Date: Nov. 3, 2016

(65) Prior Publication Data
US 2016/0315291 A1  Oct. 27, 2016

(30) Foreign Application Priority Data
Apr. 27, 2015  (CN) .......................... 2015 1 0204901

(51) Int. Cl.
*H01L 21/00* (2006.01)
*H01L 51/56* (2006.01)
*H01L 51/00* (2006.01)

(52) U.S. Cl.
CPC ............. *H01L 51/56* (2013.01); *H01L 51/003* (2013.01); *H01L 51/0097* (2013.01); *H01L 2251/5338* (2013.01)

(58) Field of Classification Search
CPC .......... H01L 29/7869; H01L 29/66969; H01L 27/1225; H01L 51/56; H01L 27/3262; H01L 51/5206; H01L 2227/323; H01L 27/127; H01L 27/3246; H01L 29/45; H01L 21/02565; H01L 29/24; H01L 29/4908
See application file for complete search history.

(56) References Cited

U.S. PATENT DOCUMENTS

2013/0093049 A1* 4/2013 Ananthan ............. C23C 14/042
257/532

\* cited by examiner

*Primary Examiner* — Robert Bachner
(74) *Attorney, Agent, or Firm* — Leong C. Lei (57) ABSTRACT

The present invention provides a method for manufacturing a flexible display device, which includes the following steps: (1) providing a flexible substrate and a number of clamps; (2) securing edges of the flexible substrate with the number of clamps; and (3) subjecting the flexible substrate to operations of exposure, development, etching, thin film deposition, annealing, and film formation, wherein in each of the operations, the clamps are adjusted in order to adjust flatness and amount of contraction of the flexible substrate and also, the clamps are adjusted to adjust angle of the flexible substrate. The present invention uses the clamps to securely clamp edges of the flexible substrate so that adjustment of the clamps may be conducted in case that deformation and deflection of the flexible substrate occurs in order to reduce the deformation and deflection of the flexible substrate and achieve precise control of accuracy of the manufacturing process thereby preventing the deformation and deflection from affecting the accuracy of the manufacturing process. In different operations, the flexible substrate can be adjusted to be horizontal, inclined, or vertical and the clamps may apply different amounts of forces to control the accuracy and reduce deformation of the substrate. No operations of laminating and peeling are necessary.

15 Claims, 6 Drawing Sheets

METHOD FOR MANUFACTURING FLEXIBLE DISPLAY DEVICE

BACKGROUND OF THE INVENTION

1. Field of the Invention

The present invention relates to the field of displaying technology, and in particular to a method for manufacturing a flexible display device.

2. The Related Arts

Currently, in the field of displaying technology, a variety of displaying techniques is available for flexible display devices. Examples include the traditional liquid crystal display techniques, bistable liquid crystal display techniques, organic light-emitting diode (OLED) display techniques, electrophoretic display techniques, electrochromism (EC) display techniques, and electroluminescent (EL) display techniques. Among them, a flexible organic light-emitting diode (FOLED) display has more advantages over the other flexible displays, such as self-luminous, fast response speed, high brightness, wide view angle, and low cost. Further, the FOLED display is a display based on flexible organic material, allowing for winding and folding and serving as a component of a wearable computer, all these making it widely applicable to specific fields, such as portable devices having excellent displaying performance and military uses.

Figure 1:
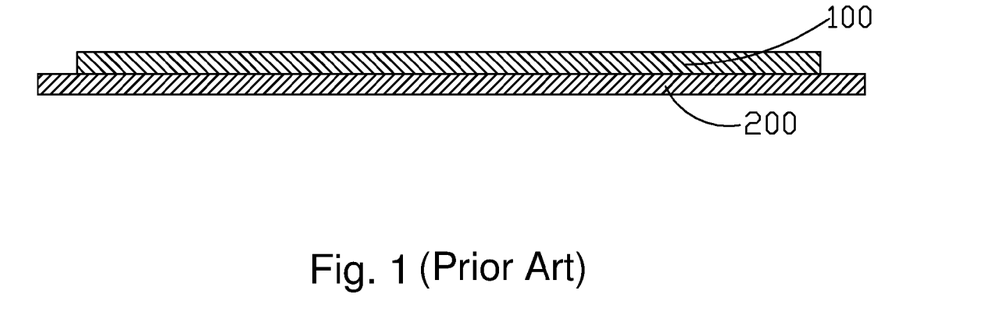
FIG. 1 is a schematic view illustrating a conventional manufacturing process of flexible display devices.
Figure 2:
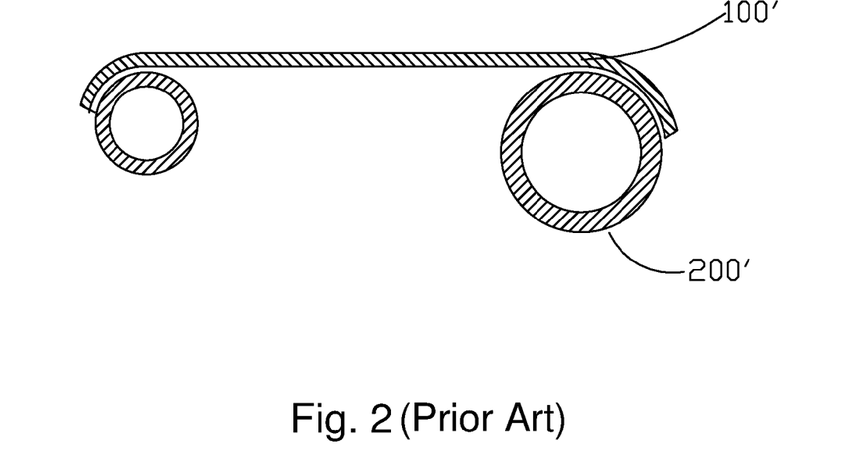
FIG. 2 is a schematic view illustrating another conventional manufacturing process of flexible display devices.

A conventional flexible display device is generally formed of a flexible substrate having a thickness less than 100 micrometers, such as a piece of ultrathin glass, a stainless steel film, and a plastic substrate. Due to the problems of being readily fragile, wrinkling, and deforming, in the manufacturing of flexible substrates, two types of manufacturing process have been commonly adopted. The first one is illustrated in FIG. 1, where a flexible substrate 100 is laminated on a glass substrate 200 or is alternatively coated on a stiff substrate through a coating process, followed by processes of making thin-film transistor (TFT) arrays, making OLEDs, and packaging. Finally, the glass substrate or the stiff substrate is removed. Such a process may readily induce stress in during the manufacturing and the flexible substrate may readily warp and deform and requires the stiff substrate to function as a backing. The baking needs to be peeled and removed after the manufacturing and this may readily induce electrostatic damage. The second way is illustrated in FIG. 2, where a flexible substrate 100' is wound around a roller 200' through a winding process and then a manufacturing process is conducted thereon. Such a process has poor accuracy and is hard to control the pulling force and is generally not a mature technique.

Thus, one of the key issues of manufacturing a flexible display device is to effectively fix a flexible substrate.

SUMMARY OF THE INVENTION

An object of the present invention is to provide a method for manufacturing a flexible display device, which allows for adjustment of flatness and amount of contraction of a flexible substrate during a manufacturing process of a flexible display device and also allows for control an angle of the flexible substrate to improve accuracy of the manufacturing process.

To achieve the above object, the present invention provides a method for manufacturing a flexible display device, which comprises the following steps:

(1) providing a flexible substrate and a number of clamps;

(2) securing edges of the flexible substrate with the number of clamps; and (3) subjecting the flexible substrate to operations of exposure, development, etching, thin film deposition, annealing, and film formation, wherein in each of the operations, the clamps are adjusted in order to adjust flatness and amount of contraction of the flexible substrate and also, the clamps are adjusted to adjust angle of the flexible substrate.

In step (3), during the exposure operation, the clamps are adjusted in such a way that fine adjustment of a shape of the flexible substrate is achieved in order to control exposure accuracy.

In step (3), during the operations of annealing and thin film deposition, forces applied from the clamps to the flexible substrate are reduced in order to reduce deformation of the flexible substrate.

In step (3), during the exposure operation, the clamps are adjusted in such a way that the flexible substrate is kept horizontal.

In step (3), during the operations of development and etching, the clamps are adjusted in such a way that the flexible substrate is minutely inclined.

In step (3), during the operation of film formation, the clamps are adjusted to set the flexible substrate in a vertical condition.

The flexible substrate is of a rectangular shape and the number of the clamps is four and in step (2), four corners of the flexible substrate are respectively and securely clamped by the four clamps.

The flexible substrate is of a rectangular shape and the number of the clamps is two and in step (2), two opposite edges of the flexible substrate are respectively and securely clamped by the two clamps.

The flexible substrate is of a rectangular shape and the number of the clamps is four and in step (2), four edges of the flexible substrate are respectively and securely clamped by the four clamps.

The flexible substrate is of a rectangular shape and the number of the clamps is plural and in step (2), each of edges of the flexible substrate is securely clamped by multiple clamps.

The present invention also provides a method for manufacturing a flexible display device, which comprises the following steps:

(1) providing a flexible substrate and a number of clamps;

(2) securing edges of the flexible substrate with the number of clamps; and (3) subjecting the flexible substrate to operations of exposure, development, etching, thin film deposition, annealing, and film formation, wherein in each of the operations, the clamps are adjusted in order to adjust flatness and amount of contraction of the flexible substrate and also, the clamps are adjusted to adjust angle of the flexible substrate;

wherein in step (3), during the exposure operation, the clamps are adjusted in such a way that fine adjustment of a shape of the flexible substrate is achieved in order to control exposure accuracy;

wherein in step (3), during the operations of annealing and thin film deposition, forces applied from the clamps to the flexible substrate are reduced in order to reduce deformation of the flexible substrate;

wherein in step (3), during the exposure operation, the clamps are adjusted in such a way that the flexible substrate is kept horizontal;

wherein in step (3), during the operations of development and etching, the clamps are adjusted in such a way that the flexible substrate is minutely inclined; and wherein in step (3), during the operation of film formation, the clamps are adjusted to set the flexible substrate in a vertical condition.

The efficacy of the present invention is that the present invention provides a method for manufacturing a flexible display device, which uses clamps to securely clamp edges of the flexible substrate so that adjustment of the clamps may be conducted in case that deformation and deflection of the flexible substrate occurs in order to reduce the deformation and deflection of the flexible substrate and achieve precise control of accuracy of the manufacturing process thereby preventing the deformation and deflection from affecting the accuracy of the manufacturing process. In different operations, the flexible substrate can be adjusted to be horizontal, inclined, or vertical and the clamps may apply different amounts of forces to control the accuracy and reduce deformation of the substrate. No operations of laminating and peeling are necessary.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
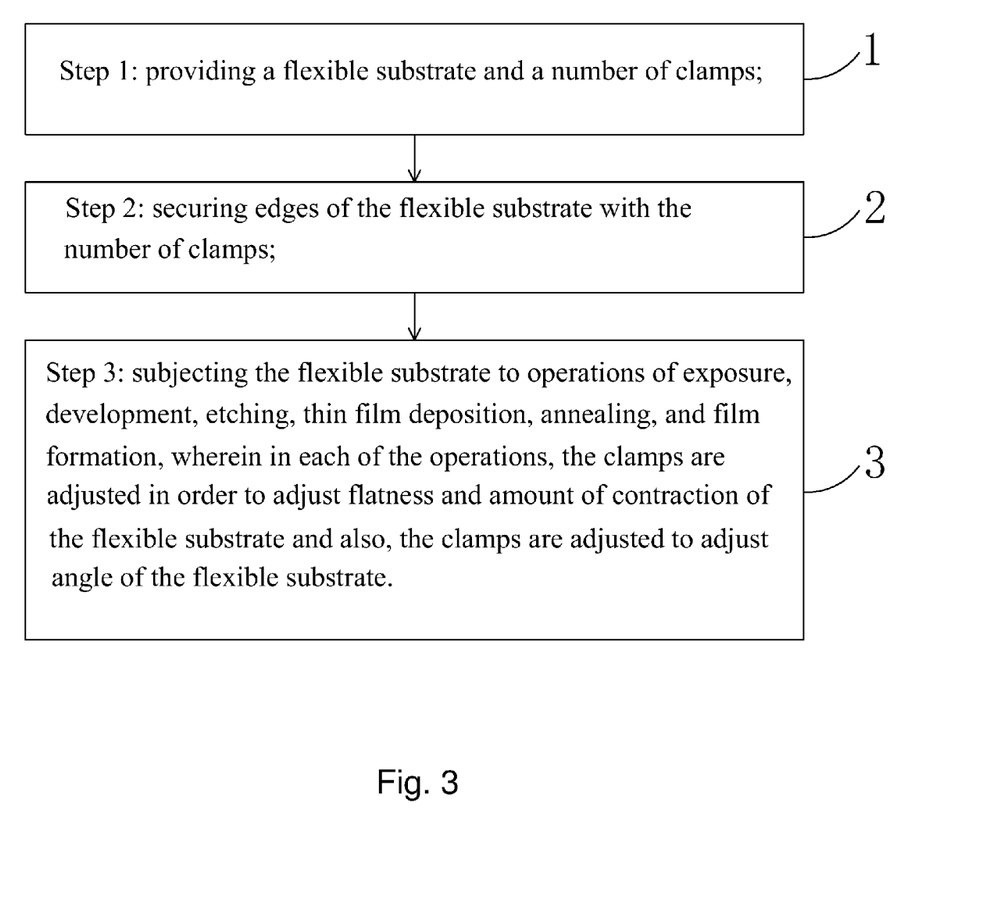
FIG. 3 is a flow chart illustrating a method for manufacturing a flexible display device according to the present invention.

Referring to FIG. 3, the present invention provides a method for manufacturing a flexible display device, which comprises the following steps:

Step 1: providing a flexible substrate 10 and a number of clamps 20.

Step 2: securing edges of the flexible substrate 10 with the number of clamps 20.

Figure 4:
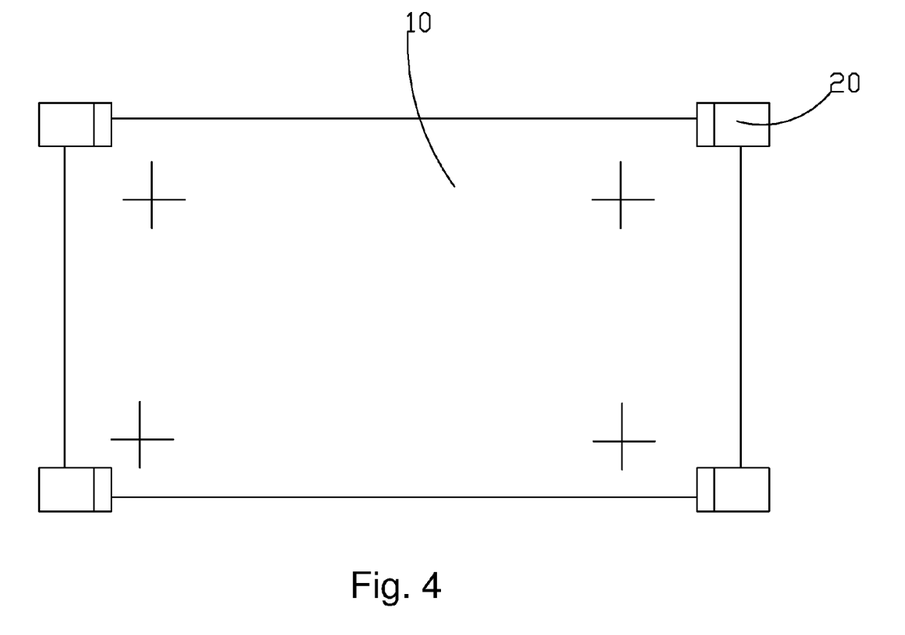
FIG. 4 is a schematic view illustrating a first way of securing a flexible substrate with clamps in the method for manufacturing the flexile display device according to the present invention.

Specifically, the flexible substrate 10 is of a rectangular shape and in an actual manufacturing process, various ways can be adopted to secure the flexible substrate 10 with the clamps 20. As shown in FIGS. 4-7, the following four ways of securing are provided as illustrative examples of the present invention:

The first way is illustrated in FIG. 4, wherein the number of the clamps 20 is four and the flexible substrate 10 has four corners that are respectively and securely clamped by the four clamps 20.

Figure 5:
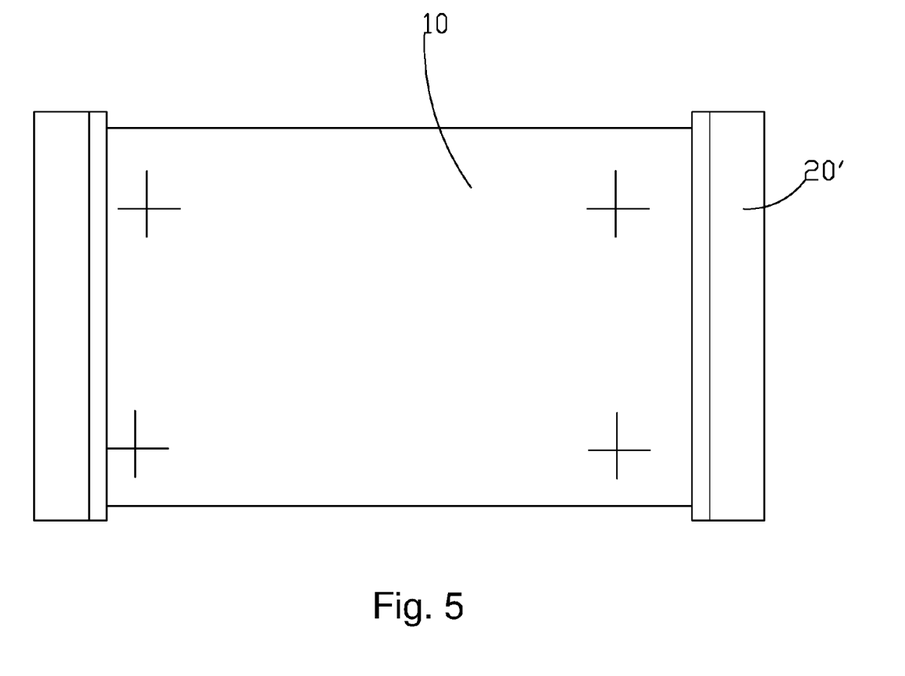
FIG. 5 is a schematic view illustrating a second way of securing a flexible substrate with clamps in the method for manufacturing the flexile display device according to the present invention.

The second way is illustrated in FIG. 5, wherein the number of the clamps 20' used is two and two opposite edges of the flexible substrate 10 are respectively and securely clamped by the two clamps 20. The clamps 20' may be arranged to have a length that is greater than a width of the flexible substrate 10.

Figure 6:
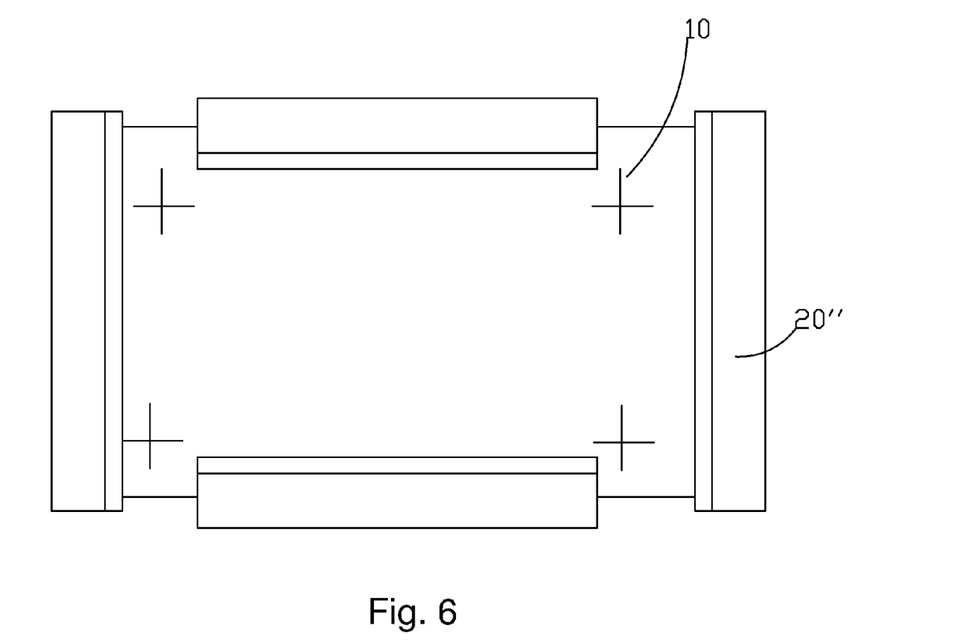
FIG. 6 is a schematic view illustrating a third way of securing a flexible substrate with clamps in the method for manufacturing the flexile display device according to the present invention.

The third way is illustrated in FIG. 6, wherein the number of the clamps 20" used is four and four edges of the flexible substrate 10 are respectively and securely clamped by the four clamps 20. The clamps 20" may be arranged to have a length that is greater than a width of the flexible substrate 10 and smaller than a length of the flexible substrate 10.

Figure 7:
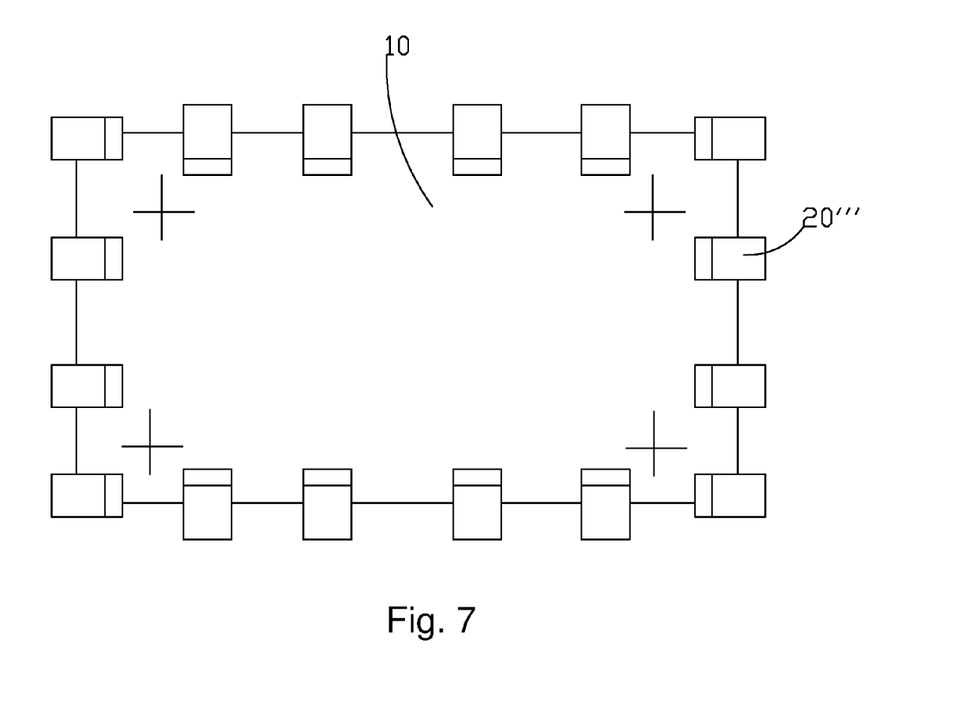
FIG. 7 is a schematic view illustrating a fourth way of securing a flexible substrate with clamps in the method for manufacturing the flexile display device according to the present invention.

The fourth way is illustrated in FIG. 7, wherein a multiplicity of clamps 20''' is used and each edge of the flexible substrate 10 is securely clamped by a number of the clamps 20.

Step 3: subjecting the flexible substrate 10 to operations of exposure, development, etching, thin film deposition, annealing, and film formation, wherein in each of the operations, the clamps 20 are adjusted in order to adjust flatness and amount of contraction of the flexible substrate 10 and also, the clamps 20 are adjusted to adjust angle of the flexible substrate 10.

Figure 8:
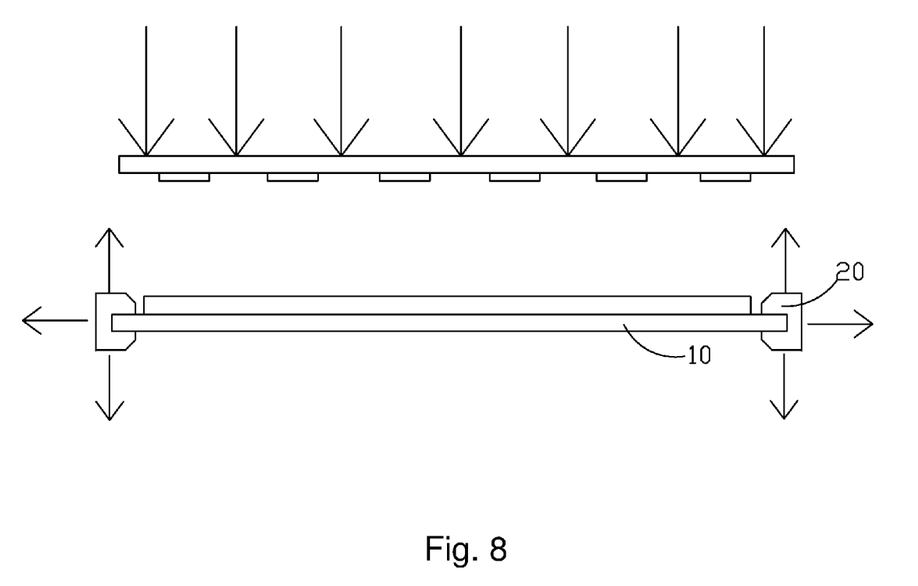
FIG. 8 is a schematic view illustrating an exposure operation of step (3) of the method for manufacturing the flexible display device according to the present invention.

Specifically, referring to FIG. 8, during the exposure operation, the clamps 20 are adjusted in such a way that fine adjustment of the shape of the flexible substrate 10 is achieved in order to control exposure accuracy and to keep the flexible substrate 10 horizontal.

During the operations of annealing and thin film deposition, forces applied from the clamps 20 to the flexible substrate 10 are reduced in order to reduce deformation of the flexible substrate 10.

During the operations of development and etching, the clamps 20 are adjusted in such a way that the flexible substrate 10 is minutely inclined.

During the operation of film formation, the clamps 20 are adjusted to set the flexible substrate 10 in a vertical condition.

Figure 9:
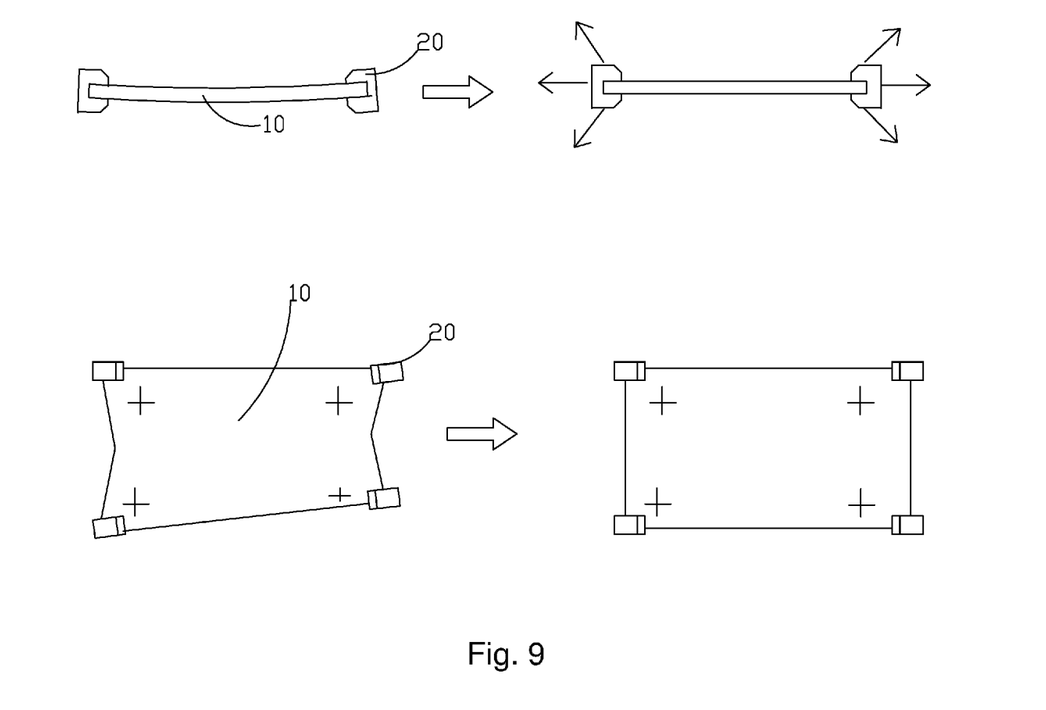
FIG. 9 is a schematic view illustrating an operation of adjusting a flexible substrate on which deformation and deflection occur in the method for manufacturing the flexible display device according to the present invention.

As shown in FIG. 9, when deformation and deflection of the flexible substrate 10 occur, the clamps 20 may be operated to apply forces thereto for achieving adjustment in order to reduce deformation and deflection and increase accuracy.

In summary, the present invention provides a method for manufacturing a flexible display device, which uses clamps to securely clamp edges of the flexible substrate so that adjustment of the clamps may be conducted in case that deformation and deflection of the flexible substrate occurs in order to reduce the deformation and deflection of the flexible substrate and achieve precise control of accuracy of the manufacturing process thereby preventing the deformation and deflection from affecting the accuracy of the manufacturing process. In different operations, the flexible substrate can be adjusted to be horizontal, inclined, or vertical and the clamps may apply different amounts of forces to control the accuracy and reduce deformation of the substrate. No operations of laminating and peeling are necessary.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a flexible display device, comprising the following steps:
   (1) providing a flexible substrate and a number of clamps;
   (2) securing edges of the flexible substrate with the number of clamps; and
   (3) subjecting the flexible substrate to operations of exposure, development, etching, thin film deposition, annealing, and film formation, wherein in each of the operations, the clamps are adjusted in order to adjust flatness and amount of contraction of the flexible substrate and also, the clamps are adjusted to adjust angle of the flexible substrate;
   wherein the clamps are adjusted through varying relative positions and relative angles therebetween.

2. The method for manufacturing the flexible display device as claimed in claim 1, wherein in step (3), during the exposure operation, the clamps are adjusted in such a way that fine adjustment of a shape of the flexible substrate is achieved in order to control exposure accuracy.

3. The method for manufacturing the flexible display device as claimed in claim 1, wherein in step (3), during the operations of annealing and thin film deposition, forces applied from the clamps to the flexible substrate are reduced in order to reduce deformation of the flexible substrate.

4. The method for manufacturing the flexible display device as claimed in claim 1, wherein in step (3), during the exposure operation, the clamps are adjusted in such a way that the flexible substrate is kept horizontal.

5. The method for manufacturing the flexible display device as claimed in claim 1, wherein in step (3), during the operations of development and etching, the clamps are adjusted in such a way that the flexible substrate is minutely inclined.

6. The method for manufacturing the flexible display device as claimed in claim 1, wherein in step (3), during the operation of film formation, the clamps are adjusted to set the flexible substrate in a vertical condition.

7. The method for manufacturing the flexible display device as claimed in claim 1, wherein the flexible substrate is of a rectangular shape and the number of the clamps is four and in step (2), four corners of the flexible substrate are respectively and securely clamped by the four clamps.

8. The method for manufacturing the flexible display device as claimed in claim 1, wherein the flexible substrate is of a rectangular shape and the number of the clamps is two and in step (2), two opposite edges of the flexible substrate are respectively and securely clamped by the two clamps.

9. The method for manufacturing the flexible display device as claimed in claim 1, wherein the flexible substrate is of a rectangular shape and the number of the clamps is four and in step (2), four edges of the flexible substrate are respectively and securely clamped by the four clamps.

10. The method for manufacturing the flexible display device as claimed in claim 1, wherein the flexible substrate is of a rectangular shape and the number of the clamps is plural and in step (2), each of edges of the flexible substrate is securely clamped by multiple clamps.

11. A method for manufacturing a flexible display device, comprising the following steps:
    (1) providing a flexible substrate and a number of clamps;
    (2) securing edges of the flexible substrate with the number of clamps; and
    (3) subjecting the flexible substrate to operations of exposure, development, etching, thin film deposition, annealing, and film formation, wherein in each of the operations, the clamps are adjusted in order to adjust flatness and amount of contraction of the flexible substrate and also, the clamps are adjusted to adjust angle of the flexible substrate;
    wherein the clamps are adjusted through varying relative positions and relative angles therebetween;
    wherein in step (3), during the exposure operation, the clamps are adjusted in such a way that fine adjustment of a shape of the flexible substrate is achieved in order to control exposure accuracy;
    wherein in step (3), during the operations of annealing and thin film deposition, forces applied from the clamps to the flexible substrate are reduced in order to reduce deformation of the flexible substrate;
    wherein in step (3), during the exposure operation, the clamps are adjusted in such a way that the flexible substrate is kept horizontal;
    wherein in step (3), during the operations of development and etching, the clamps are adjusted in such a way that the flexible substrate is minutely inclined; and
    wherein in step (3), during the operation of film formation, the clamps are adjusted to set the flexible substrate in a vertical condition.

12. The method for manufacturing the flexible display device as claimed in claim 11, wherein the flexible substrate is of a rectangular shape and the number of the clamps is four and in step (2), four corners of the flexible substrate are respectively and securely clamped by the four clamps.

13. The method for manufacturing the flexible display device as claimed in claim 11, wherein the flexible substrate is of a rectangular shape and the number of the clamps is two and in step (2), two opposite edges of the flexible substrate are respectively and securely clamped by the two clamps.

14. The method for manufacturing the flexible display device as claimed in claim 11, wherein the flexible substrate is of a rectangular shape and the number of the clamps is four and in step (2), four edges of the flexible substrate are respectively and securely clamped by the four clamps.

15. The method for manufacturing the flexible display device as claimed in claim 11, wherein the flexible substrate is of a rectangular shape and the number of the clamps is plural and in step (2), each of edges of the flexible substrate is securely clamped by multiple clamps.

* * * * *